United States Patent
Struye et al.

(10) Patent No.: US 7,220,979 B2
(45) Date of Patent: May 22, 2007

(54) OPTICAL MEMORY PLATE OR PANEL

(75) Inventors: Luc Struye, Mortsel (BE); Paul Leblans, Kontich (BE); Johan Lamotte, Rotselaar (BE)

(73) Assignee: AGFA-Gevaert, Mortsel (BE)

( * ) Notice: Subject to any disclaimer, the term of this patent is extended or adjusted under 35 U.S.C. 154(b) by 542 days.

(21) Appl. No.: 10/737,371

(22) Filed: Dec. 16, 2003

(65) Prior Publication Data

US 2004/0125639 A1  Jul. 1, 2004

(30) Foreign Application Priority Data

Dec. 20, 2002  (EP) .................. 02102864

(51) Int. Cl.
*A61B 6/00* (2006.01)
(52) U.S. Cl. .................................. 250/581
(58) Field of Classification Search ........... 250/581
See application file for complete search history.

(56) References Cited

U.S. PATENT DOCUMENTS

| | | | | |
|---|---|---|---|---|
| 4,982,362 A | * | 1/1991 | Comberg et al. | 365/118 |
| 5,540,859 A | | 7/1996 | Nakamura et al. | 252/301.4 H |
| 5,736,069 A | * | 4/1998 | Willems et al. | 252/301.4 H |
| 2001/0007352 A1 | | 7/2001 | Hell et al. | 250/484.4 |
| 2004/0159803 A1 | * | 8/2004 | Akselrod et al. | 250/581 |

FOREIGN PATENT DOCUMENTS

| | | |
|---|---|---|
| EP | 1 014 345 | 6/2000 |
| EP | 1217633 | 6/2002 |

OTHER PUBLICATIONS

Patent Abstracts of Japan, Publication No. 63086127, published Apr. 16, 1988, Toshiba Corp.
Partial European Search Report, EP 02 10 2864, Apr. 25, 2003, Stemmer.

* cited by examiner

*Primary Examiner*—David Porta
*Assistant Examiner*—Marcus Taningco
(74) *Attorney, Agent, or Firm*—Joseph T. Guy; Nexsen Pruet, LLC

(57) ABSTRACT

An optical memory plate particularly suitable for identification purposes or protection against forgery and counterfeiting radiation provides inscription of data and read-out of thus stored inscription data, comprises a europium doped alkali metal halide storage phosphor layer, and, more preferably, a stimulable CsBr:Eu phosphor substantially free of alkaline earth metals.

18 Claims, No Drawings

OPTICAL MEMORY PLATE OR PANEL

DESCRIPTION

1. Field of the Invention

The present invention relates to a heat-resistant, non light-sensitive and non-erasable optical plate, capable of storing its data over a long period of time, to a data storage optical medium and to a method of inscription of data and read-out of said data.

2. Background of the Invention

Materials suitable for use as optical memories in computers are the subject of very specific and stringent demands, more particular-ly with respect to resistance to heat.

Among current optical memory proposals and nonoptical memory designs numerous disadvantages occur, such as high access time, cost of manufacturing of such materials, low storage density, low programming speed, high error rates and high power requirements are common. Additionally loss of data in the memory may occur. Data lost from the memory upon access or as a function of time therefore require undesired "refresh" methods and techniques. So a disadvantage of numerous prior memory systems is that they lose their data upon a loss of power.

For quite a lot of panels, for whatever an application, problems may arise of identification. Sticking a lable e.g. is in most cases not allowed, due to the thickness of the label. Printing of a text is evident neither due to lack for adhesion. Erasure may further occur and loss of data may severe consequences.

OBJECTS AND SUMMARY OF THE INVENTION

A first object of the present invention is to provide an optical memory which avoids or minimizes the disadvantages discussed above.

More specifically it is an object of the present invention to provide a new and improved optical memory having capability to be marked at high data rates with well-known and currently used radiation sources, moreover showing a very good resistance to heat over a long time.

It is a further object to provide a very particular identification of materials, proving thereby authenticity, and protection against forgery of authentic materials.

The above-mentioned advantageous effects have been realized by an optical memory plate providing radiation inscription of data and read-out of thus stored inscription data, characterized in that said optical memory comprises a europium doped alkali metal halide phosphor in its data recording layer.

Specific features of the said optical memory plate are set out in claim 1 and for preferred embodiments of the invention these particular features are set out in the dependent claims.

Further advantages and embodiments of the present invention will become apparent from the following description.

DETAILED DESCRIPTION OF THE INVENTION

It has unexpectedly been found that a storage or stimulable phosphor layer, plate or panel wherein said storage phosphor is an alkali metal halide phosphor is very suitable for use as an optical memory, even when treated for a long time at a temperature of 170° C., as could unambiguously be proved by ultraviolet exposure of the said plates or panel. In a preferred embodiment said alkali metal halide phosphor is a CsX:Eu stimulable phosphor, X representing a halide selected from the group consisting of Br and Cl, and even more preferably, said phosphor is a CsBr:Eu stimulable phosphor, substantially free of alkaline earth metals.

CsX:Eu stimulable phosphors, X representing a halide selected from the group consisting of Br and Cl; and more particularly CsBr:Eu phosphors clearly show their capability as a heat-resistant optical memory, depending on the way in which said phosphor layers and panels wherein those phosphor layers act as registering or recording layers have been produced. So the desired optical emission wavelength range for which the layer or panel acts as an optical memory is strongly dependent on the way in which the phosphors have been applied to the phosphor screens or panels.

In case of the preferred CsBr:Eu stimulable phosphors, in one embodiment according to the present invention, a storage phosphor screen or panel acts as an optical memory, wherein said phosphor, present in a layer thereof, is a CsBr:Eu stimulable phosphor, wherein said phosphor is prepared by a method comprising the steps of mixing said CsBr with between $10^{-3}$ and 5 mol % of a Europium compound selected from the group consisting of $EuX'_2$, $EuX'_3$ and $EuOX'$, X' being a member selected from the group consisting of F, Cl, Br and I, preferably Br, firing said mixture at a temperature above 450° C., cooling said mixture and recovering the CsBr:Eu phosphor, followed by making a lacquer, based on said phosphor, on one or more polymer binders and one or more solvents, coating said lacquer on a substrate and drying a coated layer in order to provide a coated CsBr:Eu phosphor layer as an optical data storage layer of said optical memory plate.

In another very particular embodiment according to the present invention the optical memory plate is provided with a europium doped alkali metal halide phosphor being a CsBr:Eu phosphor, prepared by the method comprising the steps of: mixing said CsBr with between $10^{-3}$ and 5 mol % of a Europium compound selected from the group consisting of $EuX'_2$, $EuX'_3$ and $EuOX'$ (X' being a halide as above, preferably Br); firing said mixture at a temperature above 450° C.; and wherein said mixture is brought in a condition in order to allow vapor deposition of said mixture on a substrate by a method selected from the group consisting of physical vapor deposition, thermal vapor deposition, chemical vapor deposition, electron beam deposition, radio frequency deposition and pulsed laser deposition, in order to provide a binderless needle-shaped CsBr:Eu phosphor layer as optical data storage layer of said optical memory plate.

In still another embodiment according to the present invention said phosphor precursors are selected from the group consisting of at least one Cs-containing and at least one Eu-containing precursor, and more preferably, are selected from the group consisting of CsBr, $EuX_2$, $EuX_2$, EuOX and $Cs_xEu_yX_{x+\alpha y}$, wherein x/y>0.3, wherein $\alpha \geq 2$ and wherein X is a halide selected from the group consisting of Cl, Br and I and combinations thereof. For the preparation of CsBr:Eu phosphors it is understood that Br is the main halide, while Cl and I are used in minor amounts.

According to the present invention an optical memory plate providing radiation inscription of data and read-out of thus stored data has thus been realized, characterized in that said optical memory comprises a europium doped alkali metal halide phosphor layer.

In a particularly preferred embodiment the optical memory plate according to the present invention comprises as a europium doped alkali metal halide phosphor, substantially free of alkaline earth metals, a CsBr:Eu phosphor. The term "substantially free of alkaline earth metals" has been used herein as attempts to prepare BaFBr:Eu, growing in needles, causes a problem during vaporization, in that BaFBr desintegrates in $BaF_2$ and $BaBr_2$. As a consequence a molar ratio of fluorine to bromine in the vapor-deposited layer is much lower than 1. Although a solution therefor is found by vaporization of raw stock materials or precursors from 2 crucibles or boats for the preparation of the dedicated phosphor, in such a manner that the resulting phosphor satisfies the stoichiometrical requirements, no comparative properties could be found for use as in an optical memory plate as found for CsBr:Eu as a preferred phosphor. Satisfying results could not be obtained when preparing a Eu-doped phosphor having a mixed composition of alkaline earth metal halides and alkali metal halides as has e.g. been described in U.S. Pat. No. 5,540,859. Opposite thereto a europium doped alkali metal halide phosphor, substantially free of alkaline earth metals, as the desired CsBr:Eu phosphor, were outstanding.

In one embodiment according to the present invention an optical memory plate has been provided, suitable for radiation inscription with radiation having a wavelength of 400 nm or less.

In a preferred embodiment thereof said optical memory plate according to the present invention is suitable for radiation inscription which proceeds with radiation in the wavelength range from 150 nm up to 300 nm.

In another preferred embodiment said optical memory plate according to the present invention is suitable for radiation inscription which proceeds with radiation in the wavelength range from 300 nm up to 400 nm.

According to the present invention the said optical memory plate is characterized by a lowered fluorescence efficiency in the blue light wavelength range from 400 nm up to 500 nm upon irradiation with ultraviolet radiation.

In another particular embodiment according to the present invention the optical memory plate is provided with a europium doped alkali metal halide phosphor being a CsBr:Eu phosphor, prepared by a method comprising the steps of firing in separate crucibles at a temperature above 450° C. of CsBr and a Europium compound selected from the group consisting of $EuX'_2$, $EuX'_3$ and $EuOX'$ (X' being a halide, preferably Br), in amounts of said Europium compound of between $10^{-3}$ and 5 mol % versus said CsBr, wherein the crucibles are present in the same closed environment in order to allow vapor deposition of said mixture on a substrate by a method selected from the group consisting of physical vapor deposition, thermal vapor deposition, chemical vapor deposition, electron beam deposition, radio frequency deposition and pulsed laser deposition, in order to provide a binderless needle-shaped CsBr:Eu phosphor layer as optical data storage layer of said optical memory plate. According to the present invention that optical memory plate is characterized by a lowered fluorescence efficiency in the red light wavelength range from 550 nm up to 700 nm upon irradiation with ultraviolet radiation.

The data storage optical medium of the present invention comprises an optical memory plate as disclosed above, wherein said optical data storage layer comprising a europium doped alkali metal halide phosphor, and more preferably a CsBr:Eu phosphor, substantially free of alkaline earth metals, is coated on a substrate selected from the group consisting of a metal, a metal oxide, glass, amorphous carbon, quarz, a ceramic material and a heat-resistant resin. More particularly said data storage optical is provided with a substrate selected from the group consisting of aluminum oxide ($Al_2O_3$), ultraviolet-enhanced aluminum, anodized aluminum, amorphous carbon, PET, glass, colored glass, quarz, a ceramic material or a heat-resistant resin, as e.g. aramide.

According to the present invention the data storage optical medium is provided with a thin metal layer or a parylene layer, coated between said substrate and and said optical data storage layer layer comprising a europium doped alkali metal halide phosphor, more preferably a CsBr:Eu phosphor, provided that that phosphor is free of alkaline earth metals.

Furtheron the data storage optical medium according to the present invention is a medium wherein said optical data storage layer is overcoated on top thereof with a protective layer that is transmitting ultraviolet radiation in the wavelength range from 150 to 400 nm. In a preferred embodiment according to the present invention said protective layer is a quartz, a synthetic fused silica, a sapphire or a $MgF_2$ layer.

According to the present invention said data storage optical medium is a medium suitable for use in the computer industry.

In another embodiment according to the present invention said data storage optical medium is a medium, suitable for use as a stimulable or storage phosphor screen or panels in radiographic imaging systems, being non-destructive applications as well as medical diagnostic applications.

In still another embodiment a data storage optical medium according to the present invention is a medium, suitable for use in the security industry. More preferably therein, said medium is suitable for use as an identification or verification tool. A data storage optical medium according to the present invention is moreover suitable for use as a tool for protection against forgery.

In a method of recording data in a data storage optical medium comprising a europium doped alkali halide storage phosphor layer, more preferably CsBr:Eu phosphor layer, and even more preferably a binderless needle-shaped CsBr:Eu phosphor layer, wherein said phosphor is substantially free of alkaline earth metals; the step of exposing said plate with a radiation source selected from the group consisting of gas excimer lasers consisting of $F_2$ (157 nm), ArF (193 nm), KrF (248 nm), XeBr (282 nm) and XeCl (308 nm) is preferably present. In a preferred embodiment the step of exposing said plate proceeds with a radiation source selected from the group consisting of a mercury vapor lamp at 254 nm, a deuterium lamp, a xenon lamp, a krypton lamp, a quadruplicated—frequency enhanced—Nd:YAG, Nd:YFL or Nd:YVO laser, an Alexandrite laser, a dye laser and a frequency-quadruplicated diode laser.

In a particular embodiment a method of recording data in a storage optical medium even proceeds by the step of exposing said plate with X-rays having an energy in the range of 20 kVp up to 200 kVp with a dose within the range of 1 mGy to 200 mGy.

With respect to the method of reading-out of recorded data inscribed in a data storage optical medium, read-out of said data proceeds with radiation in the same wavelength range as inscription radiation.

In another embodiment the method of reading-out data inscribed in a data storage optical medium proceeds with radiation in a longer wavelength range from 550 nm up to 700 nm, than inscription radiation.

According to the present invention identification and/or protection against forgery of any substrate coatable, at least in part, with a protected layer of a stimulable CsBr:Eu phosphor layer, is applied, wherein said layer acts as a data storage optical memory plate in a data storage optical medium as set forth hereinbefore, wherein inscription of data is provided as explained and wherein read-out is provided.

Depending on the conditions wherein the preferred binderless needle-shaped CsBr:Eu phosphor optical memory plate has been manufactured a blue emission band occurs, sometimes in combination with a red emission band, which provides an optical effect as desired in order to have an optical memory.

A particularly favorable and desirable effect encountered with respect to the said optical memory is that it cannot be erased, neither by exposure to radiation energy, nor by exposure to heat. This application providing a particularly suitable optical memory is moreover not obtained by photostimulation!

EXAMPLES

While the present invention will hereinafter be described in connection with preferred embodiments thereof, it will be understood that it is not intended to limit the invention to those embodiments.

Apart from application as an optical storage memory in the computer industry, identification of screens or panels, more in particular stimulable or storage phosphor panels, is envisaged.

As a very particular application identification of needle image storage plates or panels is applied. It is not evident indeed that an identification number is provided to such a plate or panel. Sticking a lable is in most cases not allowed, due to the thickness of the label. Printing of a text is not evident either, due to lack of adhesion. The present invention however provides a method of inscription of data with an ultraviolet laser as by means of the said technique there occurs no damage of the protective layer as data storage proceeds in the phosphor layer as data storage layer. Erasure during erasure procedures, characteristic for storage or stimulable phosphor plates, screens or panels, does moreover not remove inscriptions with the ultraviolet laser. Although the identification inscription cannot be made readable on the image obtained from the energy stored in the storage phosphor particles, it is clear that the identification data are made readable in the presence of a small ultraviolet radiation source.

Only in the case when the storage phosphor shows an emission in the red part or the visible spectrum after ultraviolet irradiation, ability for inscription of red lines, figures, characters and the like, by a red laser is provided.

In order to protect the phosphor from scratches, water and other chemicals a protective layer is added on the top. However this protective layer has to be highly transmittant for the UV light used to irradiate the phosphor. Hereby the protective layer can be made of quartz, a synthetic fused silica as e.g. the materials named "UVGSFS" and "OQSFS", manufactured by MELLES GRIOT, the Netherlands; low expansion borosilicate glass, sapphire or $MgF_2$. When the topcoat is not tranmitting UV radiation, then the UV light can be allowed to pass through the support layer when this support layer is made of a highly transmittant material.

According to the present invention optical irradiation in order to write or read the memory has been realized by irradiation with radiation sources selected from the group consisting of a mercury vapor lamp (at 254 nm), a deuterium lamp, a xenon lamp and a krypton lamp (all providing selected emission lines in the desired short ultraviolet range between 200 nm and 300 nm), a quadruplicated Nd:YAG laser at 266 nm—making use of the fourth harmonic oscillation—, dye lasers having an ultraviolet emitting dye (such as e.g. BMT—benzene-methanethiol—and PTP—p-Terphenyl $C_{18}H_{14}$), excimer lasers (e.g. those with a gas as $F_2$ (157 nm), ArF (193 nm), KrF (248 nm), XeBr (282 nm) or XeCl (308 nm), and frequency-enhanced (doubled- or quadruplicated) diode lasers. The quadruplica-ted Nd:YAG, Nd:YLF and Nd:YVO or an Alexandrite laser can be used.

In a particular experiment in order to test its applicability as an optical memory for X-rays, inscription of data was tested for a CsBr:Eu plate, prepared according to the method of starting from a raw mixture of CsX and Europium compounds as described in the detailed description above. It has been found that for a dose of 25 Rontgen at 120 kV (2.5 mm Al filter) inscription with X-rays occurred. A lower ultraviolet fluorescence efficiency and a lower X-ray sensitivity were obtained, but for the purpose of having an optical memory, this phenomenon was not forming a problem.

A stimulable or storage phosphor layer containing a europium doped alkali metal halide phosphor, coated in form of a layer or coated in a storage phosphor panel and protected against humidity by a suitable protective layer, wherein said protective layer further allows transmission of ultraviolet rays, has thus been shown to be particularly suitable for use as an optical memory plate when exposed to irradiation having a wavelength of less than 400 nm as allowing inscription of data in form a text (including figures and characters) and a bar code, without however being limited thereto, and wherein said data are not erasable and are easily read-out. Besides marking storage phosphor panels, a method is thus offered by the present invention in order to provide identification (proving authenticity and protecting against forgery) of said panels or of any carrier partially coated with such a protected phosphor layer.

Having described in detail preferred embodiments of the current invention, it will now be apparent to those skilled in the art that numerous modifications can be made therein without departing from the scope of the invention as defined in the appending claims.

What is claimed is:

1. Method of recording data in an optical memory plate by the step of exposing said plate by radiation inscription proceeds with radiation having a wavelength of 400 nm or less and providing read-out wherein said optical memory comprises a europium doped alkali metal halide storage phosphor layer, substantially free of alkaline earth metals by the step of exposing said plate by radiation inscription with a red laser, provided that emission in the red part of the visible spectrum appears after ultraviolet radiation.

2. Method of recording data in an optical memory plate of claim 1, wherein said europium doped alkali metal halide phosphor layer, substantially free of alkaline earth metals is a CsBr:Eu phosphor layer.

3. Method of recording data in an optical memory plate of claim 1, wherein said CsBr:Eu phosphor layer is a binderless needle-shaped CsBr:Eu phosphor layer.

4. Method of recording data in an optical memory plate of claim 1 wherein said inscription and read-out of said optical memory plate inscribed with data from at least one application selected from the group consisting of computer system, radiographic imaging systems, security system, identification or verification system, and forgery protection system.

5. Method of recording data in an optical memory plate according to claim 1, by the step of exposing said plate with a radiation source selected from the group consisting of a mercury vapor lamp at 254 nm, a deuterium lamp, a xenon lamp, a krypton lamp, a quadruplicated-frequency enhanced-Nd:YAG, Nd:YFL or Nd:YVO laser, an Alexandrite laser, a dye laser, a frequency-quadruplicated diode laser and gas excimer lasers consisting of $F_2$ (157 nm), ArF (193 nm), KrF (248 nm), XeBr (282 nm) or XeCl (308 nm).

6. Method of reading-out data inscribed in an optical memory plate of claim 5 wherein read-out of data proceeds with radiation in the same wavelength range as radation inscription.

7. Method of reading-out data inscribed in an optical memory plate of claim 5 wherein read-out of date proceeds with radiation in a longer wavelength range from 550 nm up to 700 nm than said inscription radiation.

8. Method of reading-out data inscribed in an optical memory plate of claim 7 wherein said storage phosphor layer is overcoated on top thereof with a protective layer that is transmitting ultraviolet radiation in the wavelength range from 150 to 400 nm.

9. Method of recording data in an optical memory plate of claim 1 further comprising reading-out data inscribed wherein read-out of data proceeds with radiation in the wavelength range of 400 nm or less.

10. Method of recording data in an optical memory plate of claim 1 further comprising reading-out data inscribed, wherein read-out of data proceeds with radiation in a longer wavelength range from 550 nm up to 700 nm than said inscription radiation.

11. Method of recording data in an optical memory plate of claim 1 wherein radiation inscription which proceeds with radiation in the wavelength range from 150 nm up to 300 nm.

12. Method of recording data in an optical memory plate of claim 11 further comprising reading-out data inscribed, wherein read-out of data proceeds with radiation in the wavelength range of 400 nm or less.

13. Method of recording data in an optical memory plate of claim 11 further comprising readingout data inscribed, wherein readout of data proceeds with radiation in a longer wavelength range from 550 nm up to 700 nm than said inscription radiation.

14. Method of recording data in an optical memory plate of claim 1 wherein radiation inscription which proceeds with radiation in the wavelength range from 300 nm up to 400 nm.

15. Method of recording data in an optical memory plate of claim 14 further comprising readingout data inscribed, wherein readout of data proceeds with radiation in the wavelength range of 400 nm or less.

16. Method of recording data in an optical memory plate of claim 14 further comprising reading-out data inscribed, wherein read-out of data proceeds with radiation in a longer wavelength range from 550 nm up to 700 nm than said inscription radiation.

17. Method of recording data in an optical memory plate by the step of exposing said plate by radiation inscription proceeds with radiation having a wavelength of 400 nm or less and providing read-out wherein said inscription and read-out of said optical memory plate incripted with data from at least one application selected from the group consisting of computer system, radiographic imaging systems, security system, identification or verification system, and forgery protection system wherein said inscription is an inscription of data in form of a text, including figures and characters, and a bar code.

18. Method of recording data in an optical memory plate by the step of exposing said plate by radiation inscription proceeds with radiation having a wavelength of 400 nm or less and providing read-out wherein said inscription and read-out of said optical memory plate incripted with data from at least one application selected from the group consisting of computer system, radiographic imaging systems, security system, identification or verification system, and forgery protection system wherein said inscription of data is not erasable.

\* \* \* \* \*